United States Patent [19]

Shimizu et al.

[11] Patent Number: 5,260,152
[45] Date of Patent: Nov. 9, 1993

[54] PHASE SHIFTING MASK AND METHOD OF MANUFACTURING SAME

[75] Inventors: Hideo Shimizu; Hiroichi Hawahira, both of Kanagawa, Japan

[73] Assignee: Sony Corporation, Tokyo, Japan

[21] Appl. No.: 874,211

[22] Filed: Apr. 27, 1992

Related U.S. Application Data

[62] Division of Ser. No. 640,993, Jan. 14, 1991, abandoned.

[30] Foreign Application Priority Data

| Jan. 12, 1990 | [JP] | Japan | 2-5606 |
| Mar. 20, 1990 | [JP] | Japan | 2-69979 |
| May 2, 1990 | [JP] | Japan | 2-116464 |

[51] Int. Cl.⁵ .................................................. G03F 9/00
[52] U.S. Cl. .......................................... 430/5; 430/22; 430/269; 430/311
[58] Field of Search ............... 430/5, 22, 269, 311, 430/390

[56] References Cited

U.S. PATENT DOCUMENTS 5,045,417  9/1991  Okamoto .................... 430/5

FOREIGN PATENT DOCUMENTS 234547   2/1987  European Pat. Off. .
0383534  8/1990  European Pat. Off. .
0395425  10/1990 European Pat. Off. .
0401795  12/1990 European Pat. Off. .

*Primary Examiner*—Marion E. McCamish
*Assistant Examiner*—S. Rosasco
*Attorney, Agent, or Firm*—Hill, Steadman & Simpson

[57] ABSTRACT

A method for manufacture of such a phase shifting mask comprises the steps of forming a light shielding layer on a substrate; forming a photoresist on the light shielding layer; patterning the photoresist to form a resist pattern; providing an opening in the light shielding layer by the use of the resist pattern as a mask, thereby forming a light shielding pattern; etching the substrate anisotropically to form a phase shifting segment; side etching the light shielding pattern to form a light shielding region; and removing the resist pattern.

3 Claims, 14 Drawing Sheets

PHASE SHIFTING MASK AND METHOD OF MANUFACTURING SAME

This is a division of application Ser. No. 640,993, filed Jan. 14, 1991, now abandoned.

BACKGROUND OF THE INVENTION

1. Field of the Invention

The present invention relates to a phase shifting mask and a method of manufacturing the same. The mask produced by the present invention is adapted for use in forming a variety of patterns, such as a resist pattern for example in the process of manufacturing a semiconductor device. And the present invention is capable of minimizing the number of required steps in manufacture of such a phase shifting mask.

2. Description of the Prior Art

In semiconductor devices and so forth, the processing dimensions have tended to become extremely smaller year after year. Relative to the technology of photolithography employed for manufacture of such miniaturized semiconductor devices, there is known, as a means for further enhancing the resolution, a phase shifting technique which causes a phase difference in the light transmitted through a mask, thereby improving the light intensity profile.

The phase shifting method is disclosed in Japanese Patent Laid-open No. Sho 58 (1983)-173744; Marc D. Levenson et al., "Improving Resolution in Photolithography with a Phase Shifting Mask", IEEE Transactions on Electron Devices, Vol. ED-29, No. 12, Dec. 1982, pp. 1828-1836; and Marc D. Levenson et al., "The Phase Shifting Mask II; Imaging Simulations and Submicrometer Resist Exposures", Ditto, Vol. ED-31, No. 6, Jun. 1984, pp. 753-763.

The conventional phase shifting method known heretofore will now be described below with reference to FIG. 1(a). In an exemplary case of forming a line-and-space pattern, it is usual that, as shown in FIG. 1 (a), a light shielding region 10 is formed by the use of a light shielding material such as chromium on a transparent substrate 1 of quartz or the like, and an arrangement of repeated line-and-space patterns is formed to produce an exposure mask. The intensity distribution of the light transmitted through such an exposure mask is represented by a curve A1 in FIG. 1 (a), wherein the intensity is zero in the light shielding region 10 while the light is transmitted through the other regions (light transmitting segments 12a, 12b). Viewing one light transmitting segment 12a as an example, the intensity of the light transmitted therethrough and irradiated to a work member to be exposed is distributed as represented by a curve A2 in FIG. (a), wherein hill-like maximums existent at the feet on both sides due to the diffraction of the light and so forth. The light passed through the light transmitting segment 12b is represented by a one-dot chained line. When the light rays obtained through the individual transmitting segments 12a, 12b are mutually combined, the light intensity distribution is deprived of its sharpness as indicated by a curve A3 to consequently blur the image due to diffraction of the light, hence failing in a sharp exposure. In contrast therewith, if phase shifting films 11a are provided on the light transmitting segments 12a, 12b of the repeated patterns in alternate fashion as shown in FIG. 1 (b), any blur of the image resulting from diffraction of the light is eliminated by inversion of the phase to eventually achieve transfer of a sharp image, thereby improving the resolution and the focusing allowance. More particularly, when a phase shifting film 11a is formed on the light transmitting segment 12a as shown in FIG. 1 (b) in such a manner as to cause a phase shift of 180°, for example, the light passed through the phase shifting film 11a is inverted as represented by a curve B1. Meanwhile the light obtained through the adjacent light transmitting segment 12a is not passed through the phase shifting film 11a, so that none of such a phase inversion is induced. Therefore, on the work member to be exposed, the mutually phase-inverted light rays cancel each other in the position B2 at the foot of the light intensity distribution, whereby the distribution of the light irradiated to the work member is rendered ideally sharp, as represented by a curve B3 in FIG. 1 (b).

In the example mentioned, the greatest advantage is attainable by causing a 180° inversion of the phase to ensure the above-described effect. However, for realizing such a satisfactory result, it is necessary for the phase shifting film 11a to have an adequate thickness $$d = \frac{\lambda}{2(n-1)}$$

(where n denotes the refractive index of the phase shifting film, and λ denotes the wavelength of the exposure light).

In the process of forming a pattern by an exposure, it is customary that a member used for reduced-size projection is termed a reticle, and a member for life-size projection is termed a mask; or a member corresponding to an original sheet is termed a reticle, and a member obtained by duplicating such a reticle is termed a mask. In the present invention, any of the masks and reticles classified by such various definitions is termed a mask in general.

Although the technique utilizing the conventional phase shifting mask mentioned above is remarkably effective for forming an arrangement of repeated patterns such as line-and-space patterns described with reference to FIG. 1, there still exists a problem that such a mask is not easily usable in forming isolated patterns which are not repetitive.

As mentioned, the phase shifting technique causes a phase difference between the light rays for exposure of mutually adjacent patterns and utilizes the effect that the respective light intensities cancel each other. However, since mutually proximate light rays are not existent in the case of forming an isolated line or a contact hole, the above prior art is not directly adapted for realizing the phase shifting technique.

It has therefore been necessary that, as illustrated in FIG. 2 (a), a light transmitting region 12 for transmitting exposure light therethrough without causing any phase shift (phase shift 0°) is provided in conformity with a desired pattern to be formed, and a phase shifting region 11 for causing a phase shift of exposure light (e.g., phase shift 180°) is provided in the proximity of the light transmitting region 12. (Refer to Terasawa et al., Second Draft for Lecture in 49th Applied Physics Society Meeting, Autumn 1988, p. 497, 4a-K-7).

In such prior art, a main space is required for providing a pattern-forming light transmitting segment 12 within a light shielding region 10, and further a subspace is also required for providing phase shifting segments 11. The phase shifting segments 11 are formed along the two sides of and in the proximity of a rectangular light transmitting region 12 which is a main space in a mask of FIG. 2 (a) for forming an isolated line pattern; or the segments 11 are formed along and in the proximity of four sides of a square light transmitting region 12 in a mask of FIG. 2 (b) for forming a hole pattern.

In such prior art, the light transmitting segment 12 and the phase shifting segment 11 need to be spaced apart from each other since any improperly small distance therebetween induces excessive cancellation of the respective light intensities to consequently reduce the transfer pattern. Therefore a problem arises with regard to the necessity of a large area for forming each pattern.

Furthermore, the phase shifting segment 11 needs to have certain dimensions since the effect thereof is diminished in accordance with a dimensional decrease. As a result, there arises another problem that the pattern of the phase shifting segment 11 itself is transferred. FIG. 3 illustrates an exemplary case of forming an isolated space 7 by using the mask of FIG. 2 (a). As shown with some exaggeration, it is unavoidable that a pattern 71 derived from the phase shifting segment 3 is formed.

OBJECTS AND SUMMARY OF THE INVENTION

An object of the present invention is to provide an improved phase shifting mask which is capable of reducing a required pattern-forming area to bring about an advantage with respect to the space while preventing transfer of any unrequired pattern of a phase shifting film even in forming an isolated line (space) or a hole pattern.

Another object of the present invention resides in providing an improved method for manufacture of a phase shifting mask which is capable of minimizing the number of required steps, particularly with elimination of the necessity of executing a plotting step twice to obtain a mask of a desired structure.

As illustrated in FIG. 4 (a) and (b), the phase shifting mask of the present invention comprises a transparent region 20 with respect to exposure light, and a light shielding region 10. The transparent region 20 has a light transmitting segment 12 to directly transmit the exposure light therethrough, and phase shifting segments 11, 11a, 11b to transmit the exposure light therethrough with a phase difference from the light transmitted through the segment 12. The light shielding region 10 is so formed as to be adjacent to at least the phase shifting segments 11, 11a, 11b or the light transmitting segment 12, and the phase shifting segments 11, 11a, 11b are formed adjacent to the light transmitting segment 12. The light transmitting segment may be so composed as to permit transmission of the exposure light without any phase shift.

In both examples of FIG. 4, the light shielding region 10 is positioned adjacent to the phase shifting segments 11, 11a, 11b. However, the arrangement may be so modified that the light shielding region 10 is adjacent to the light transmitting segment 12. More specifically, in the example of FIG. 4 (a), two rows of phase shifting segments 11a, 11b are formed adjacent to both sides of a light transmitting segment 12 corresponding to an isolated line (space) pattern, and the phase shifting segments 11a, 11b are positioned adjacent to the surrounding light shielding region 10. However, the above arrangement may be so modified that a phase shifting segment of the shape corresponding to a desired pattern may be formed at the center, and the rows of light transmitting segments may be formed on both sides of the phase shifting region in such a manner that the light transmitting segments and the light shielding region 10 adjoin mutually.

Meanwhile in another example shown in FIG. 4 (b), a phase shifting segment 11 is formed adjacent to a light transmitting segment 12 which corresponds to a desired hole pattern, in a manner to surround the four sides of the transmitting segment 12, and the phase shifting segment 11 adjoins the peripheral light shielding region 10. However, the above arrangement may be so modified that a phase shifting segment of the shape corresponding to a desired hole pattern is formed at the center, while a light transmitting segment is formed in a manner so as to surround the phase shifting segment, and the light transmitting segment and the light shielding segment 10 adjoin mutually.

Regarding the exemplary structure illustrated, the same phase shifting effect can be attained even in each of the modifications where the phase shifting segments 11, 11a, 11b are positionally replaced with the light transmitting segment 12. This will be easily understood from the principle of a phase shifting mask that the phases of mutually proximate light rays cancel each other to consequently enhance the resolution.

In embodying the present invention, generally a transparent region 20 on a mask is divided into two mutually adjacent segments, and such segments are composed so as to cause a phase difference between exposure light transmitted therethrough. The effect thereby achieved becomes maximum when the phase difference is 180°.

In carrying out the present invention, the light transmitted through the periphery of the central area (light transmitting segment 12 in FIG. 4) of the transparent region 20 is canceled by the light transmitted through the outer difference-phase areas (phase shifting segments 11, 11a, 11b in FIG. 4), so that the intensity of the former light is rendered lower than the intensity obtained in a different structure where the central area (light transmitting segment 12) alone is existent. Therefore, the resultant pattern becomes considerably smaller as compared with the pattern exposed and transferred in the structure where merely the central area (light transmitting segment 12) is existent. For this reason, the central area (light transmitting segment 12) is formed greater than the size of the desired pattern to be obtained so that it becomes possible to transfer a pattern of the desired size. And the resolution of the pattern thus obtained can be enhanced due to the effect of the phase shifting process.

In an exemplary case of transferring a contact hole pattern by the use of the above-described structure, the following effects are attainable. This example represents a case of forming a contact hole of a 0.15-$\mu$m square by using a KrF excimer laser (light wavelength 248 nm).

According to a conventional exposure mask obtained merely with a pattern of a 0.35-$\mu$m square transparent region without employment of the phase shifting technique, the light intensity distribution on a wafer or a similar work member to be exposed becomes as graphically shown in FIG. 5 (a). Meanwhile, in the case of using another conventional mask of FIG. 2 (b) which utilizes the phase shifting technique, the light intensity is rendered higher as graphically shown in FIG. 5 (b). However, since a sub-space (FIG. 2 (b)) constituting a phase shifting segment 11 alone has a light intensity to a certain degree, such pattern may possibly be transferred as well. In contrast with the above, when the mask of FIG. 4 (b) according to the present invention is employed, the light intensity can be raised merely in the hole area as graphically shown in FIG. 5 (c).

In FIG. 5 (a) through (c), the light intensities denote the results of calculations, and the values thereof are indicated by equi-intensity curves of the exposure surface. In each diagram, the abscissa and ordinate represent the lengths in μm.

As will be apparent from the comparison among the diagrams of FIG. 5, if the central area (light transmitting segment 12 refer to FIG. 4 (b)) of the transparent region 20 in the present invention of FIG. 5 (c) is formed to be a 0.46-μm square and the peripheral opening is formed to be a 0.70-μm square, then substantially the same light intensity distribution as that of FIG. 5 (b) can be obtained.

Thus, according to the phase shifting mask of the present invention, the space can be minimized without inducing transfer of any unrequired pattern, hence realizing a satisfactory phase shifting technique that ensures a high resolution.

Each of FIGS. 6 (a) through (c) graphically show the light intensity distribution obtained on an exposed work member such as a wafer by the use of a KrF excimer laser in transferring the isolated line pattern of 0.25 μm in width. In FIG. 6, the abscissa represents a length in μm, and the ordinate represents an absolute value of the light intensity on the exposed work member with the irradiated light regarded as 1.

FIG. 6 (a) graphically shows the result obtained relative to a conventional mask without using the phase shifting technique, wherein the light intensity distribution Ia on the exposed work member is curved in conformity with the irradiated light IIa passed through the light transmitting segment of the mask. The maximum light intensity in the distribution Ia on the exposed work member was 0.5299.

FIG. 6 (b) graphically shows the result obtained by one conventional phase shifting mask of FIG. 2 (a). The intensity distribution Ib1 of the pattern exposure light corresponding to the irradiated light IIb1 through the light transmitting segment 12 in FIG. 2 (a) indicates a greatest maximum intensity of 0.6640. However, a sub-peak is generated in the intensity distribution Ib2 of the irradiated light IIb2 through the phase shifting segment 11, and its maximum value is considerably large, namely 0.2902. This signifies that a possibility is high with regard to transfer of an unrequired pattern.

In contrast therewith, the result obtained relative to the example of FIG. 4 (a) of the present invention is as graphically shown in FIG. 6 (c), wherein the light intensity distribution Ic1 on the exposed work member corresponding to the irradiated light IIc1 through the light transmitting segment 12 in FIG. 1 (a) indicates a maximum intensity of 0.6788, which is greater than any of the above values. It is further obvious that substantially no peak is generated in the phase shifting segments 11a, 11b of FIG. 4 (a) corresponding to the irradiated light IIc2, hence preventing transfer of any unrequired pattern.

The above and other features and advantages of the present invention will become apparent from the following description which will be given with reference to the illustrative accompanying drawings.

BRIEF DESCRIPTION OF THE DRAWINGS

FIG. 1 (b) illustrates the principle of a phase shifting exposure mask according to the present invention;

DESCRIPTION OF THE PREFERRED EMBODIMENTS

Embodiment-1

Figure 1A:
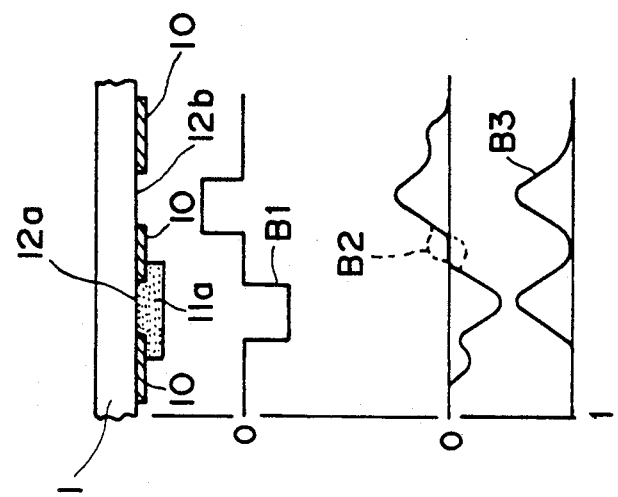
FIG. 1 (a) illustrates the principle of a conventional phase shifting exposure mask.
Figure 1B:
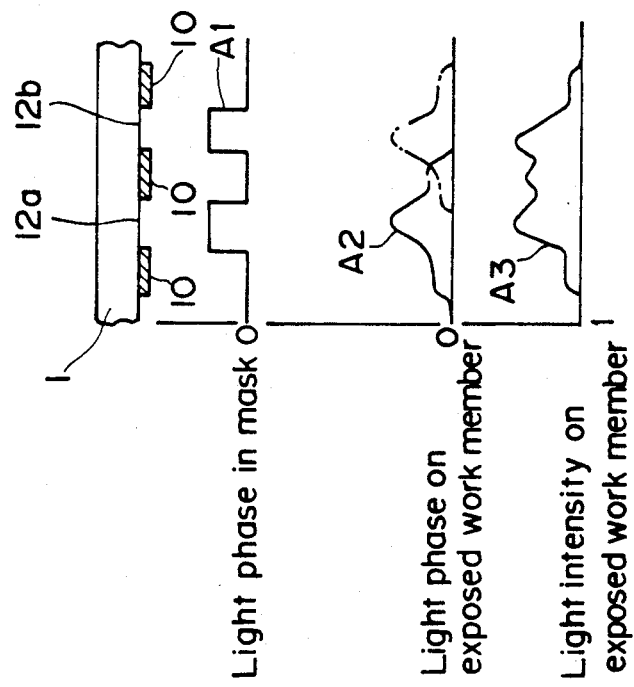
Figure 2A:
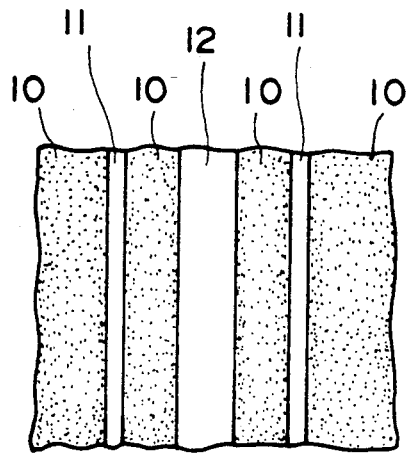
FIG. 2 (a) and (b) illustrate exemplary structures of conventional phase shifting masks.
Figure 2B:
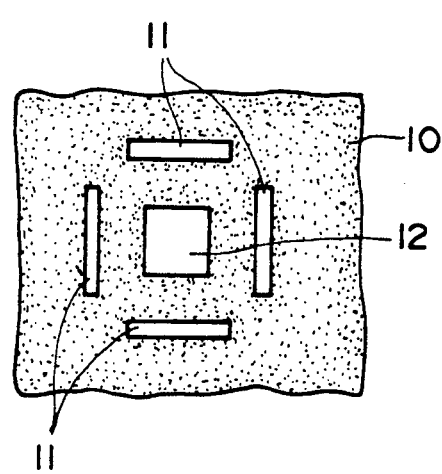
Figure 3:
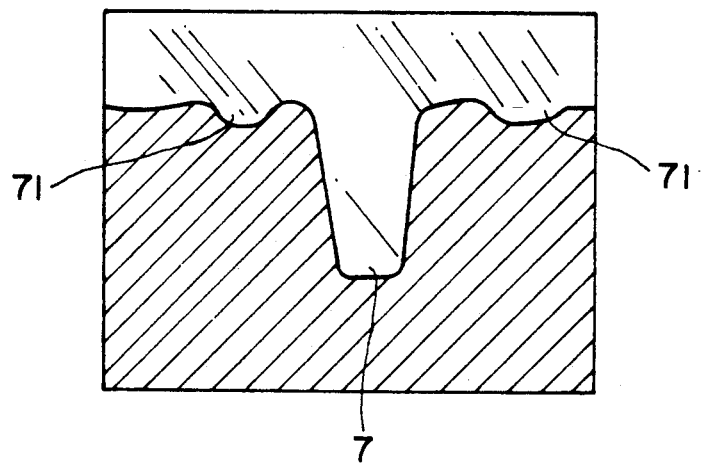
FIG. 3 is a partially sectional perspective view showing the problems in the conventional examples.

This embodiment comprises the following steps as illustrated in FIG. 7 (a) through (f). An opening 10a is provided in a light shielding layer 10' (FIG. 7 (a) and (b)) to form a light shielding pattern 10b shown in FIG. 7 (c), and then the light shielding pattern 10b is processed by side-etching while being masked with a photoresist 2 to obtain a structure of FIG. 7 (e), thereby forming a light shielding region 10 (FIG. 7 (f)) of the phase shifting mask.

Further detail of this embodiment will be described more specifically below.

In this embodiment, a film of a material having a light shielding property (chromium or any other material such as heavy metal or oxide thereof suited to shield exposure light) is formed as a light shielding layer 10' on a substrate 1 (of silicon dioxide or the like) having light transmitting property; and a photoresist 2' is formed in the shape of a film on the light shielding layer 10' by coating or the like to thereby produce a structure of FIG. 7 (a).

Subsequently an EB (electron beam) plotting step is executed, and the photoresist 2' is patterned to thereby form a resist pattern 2 with a resist opening 21, as illustrated in FIG. 7 (b).

In a next step, a light shielding pattern 10b with an opening 10a is obtained by the ordinary technique of photolithography while being masked with the resist pattern 2, as illustrated in FIG. 7 (c). Since the opening 10a corresponds to the phase shifting segment 12 (see FIG. 7 (f)) of a final structure, both the opening 10a and the resist opening 21 are formed in conformity therewith.

Thus, the resist pattern 2 is obtained by EB-plotting and developing of the resist 2', and the light shielding layer 10' is patterned by etching or the like while being masked with such a resist pattern. Until this stage, the processing steps are the same as those adopted in manufacture of an ordinary reticle, and therefore the known technique may be employed.

Subsequently in this embodiment, the substrate 1 is etched while being masked directly with the resist pattern 2, whereby a recess 1a is formed in the substrate as illustrated in FIG. 7 (d). The etching depth d (depth of the recess 1a) is selectively determined as $$d = \frac{\lambda}{2(n-1)}$$

where λ denotes the wavelength of light employed for exposure, and n denotes the refractive index of the substrate 1 to the light. The phase shifting effect is rendered maximum when the above condition is satisfied.

Subsequently the light shielding pattern 10b is side-etched while being masked with the resist pattern 2, whereby a structure of FIG. 7 (e) is obtained with a light shielding region 10 in which the light shielding pattern 10b is partially etched on both sides of the recess 1a in the substrate 1. Denoted by reference numerals 10c, 10d are the portions removed by the etching in this step.

In the above procedure, "side etching" signifies etching in a horizontal direction (leftward-rightward lateral direction in the drawing) orthogonal to the depth of the light shielding pattern 10b (upward-downward vertical direction in the drawing). Such side etching can be executed with a suitable agent which causes an erosive action on the material of the light shielding pattern 10b. For example, the side etching can be effected in a wet etching mode with a selected etching liquid which meets the above requirement. Since the side-etched portions 10c, 10d correspond to the light transmitting segments 11a, 11b respectively as illustrated in FIG. 7 (e), the amount of such etching is determined in conformity with the desired size.

Finally the resist pattern 2 is removed to produce a phase shifting mask structure of FIG. 7 (f) which comprises a transparent region 20 with respect to exposure light and a light shielding region 10 to shield such exposure light, wherein the transparent region 20 has light transmitting segments 11a, 11b to directly transmit the exposure light therethrough, and the phase shifting segment 12 to transmit the exposure light therethrough with a phase difference from the light passed through the light transmitting segments.

Figure 4A:
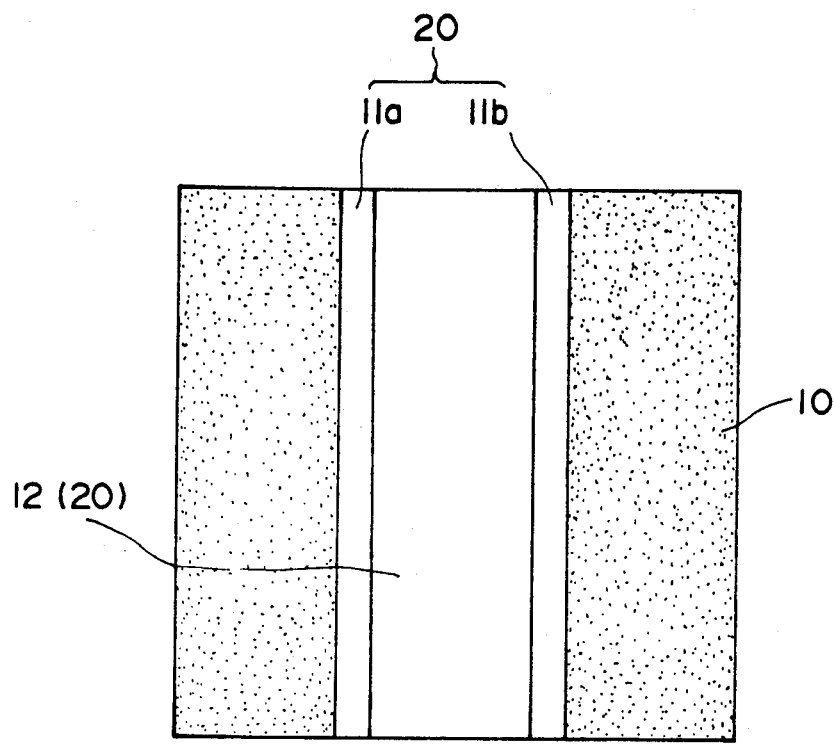
FIG. 4 (a) and (b) are plan views illustrating the structures of exemplary phase shifting masks according to the present invention.
Figure 4B:
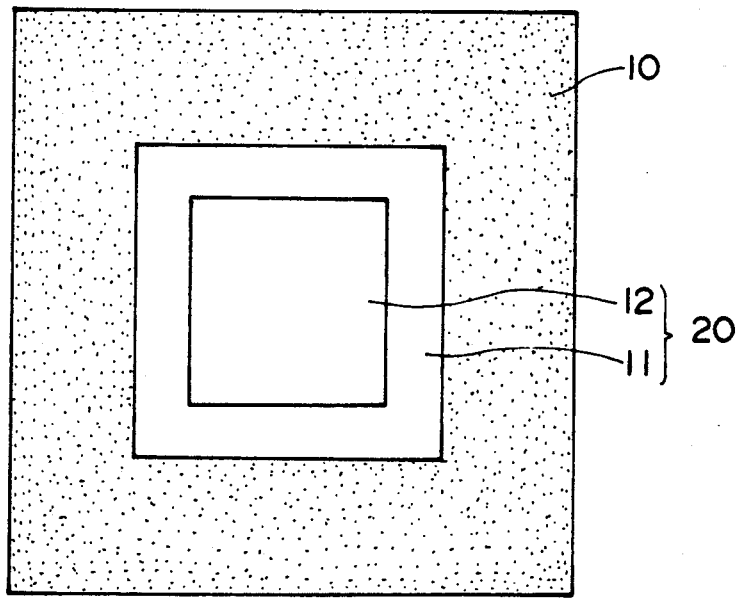
Figure 5A:
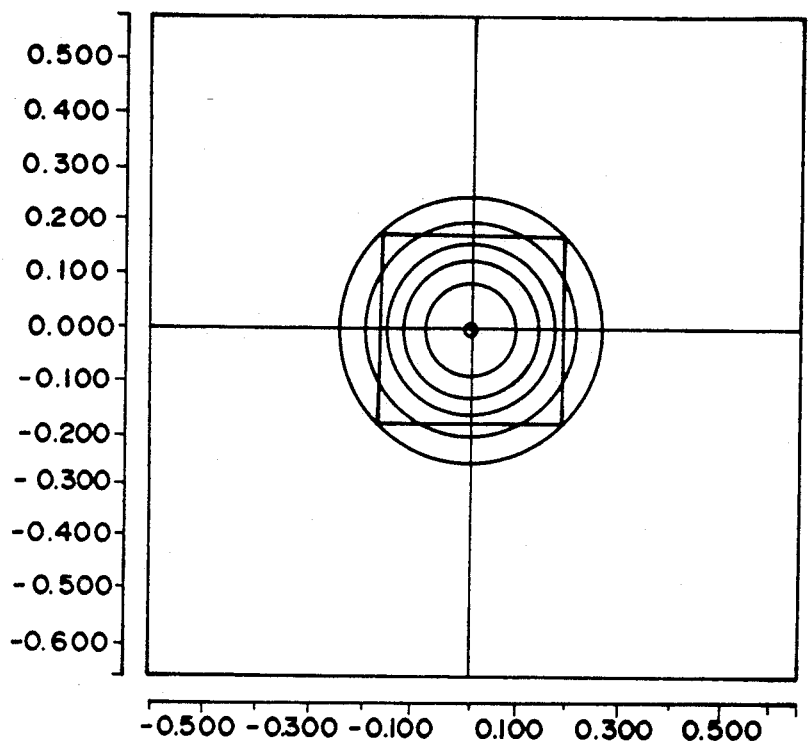
FIG. 5 (a) through (c) and FIG. 6 (a) through (c) graphically show the light intensity distributions for explaining the function of the present invention.
Figure 5C:
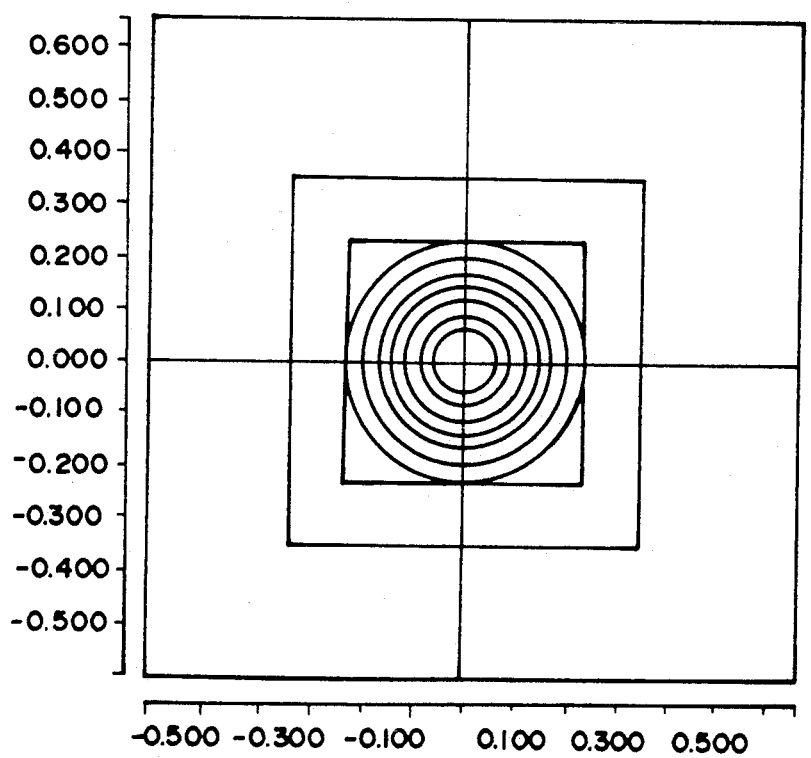
Figure 5B:
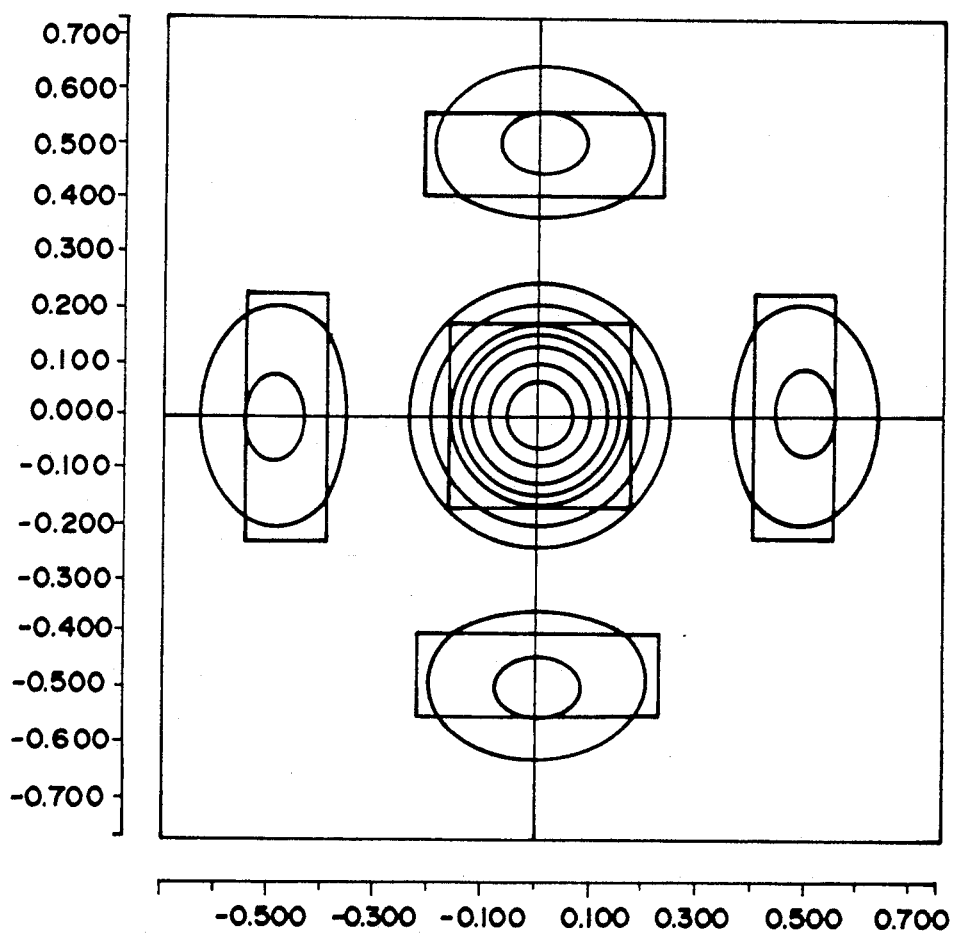
Figure 6A:
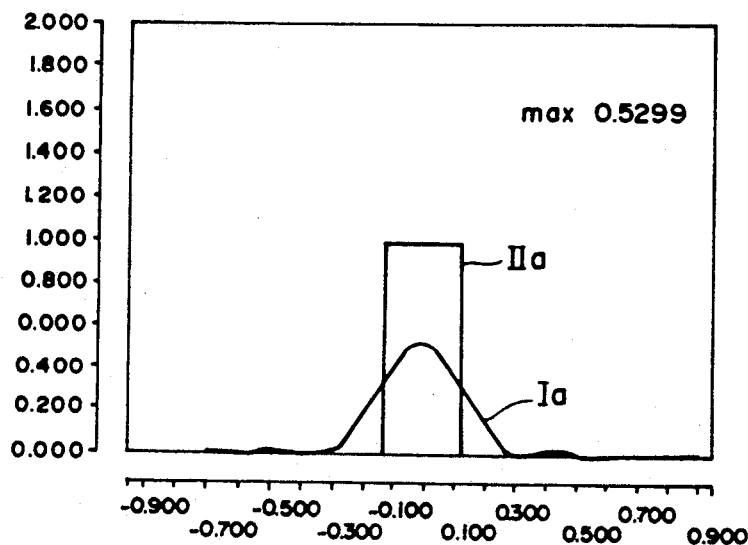
Figure 6B:
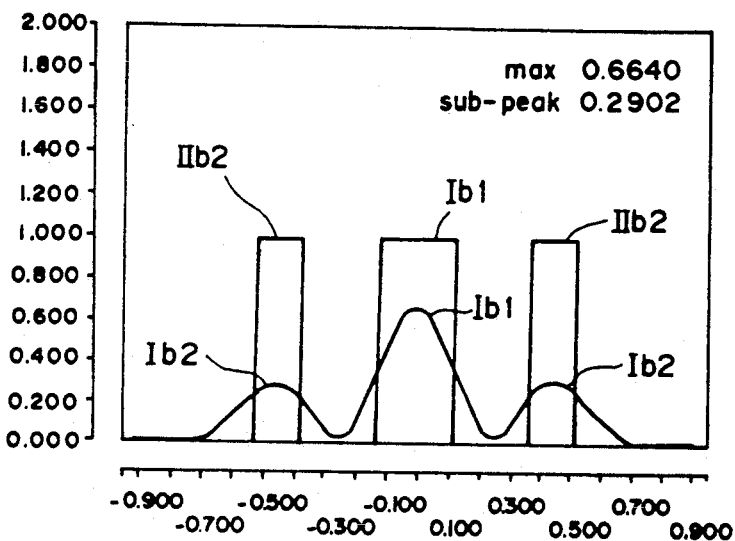
Figure 6C:
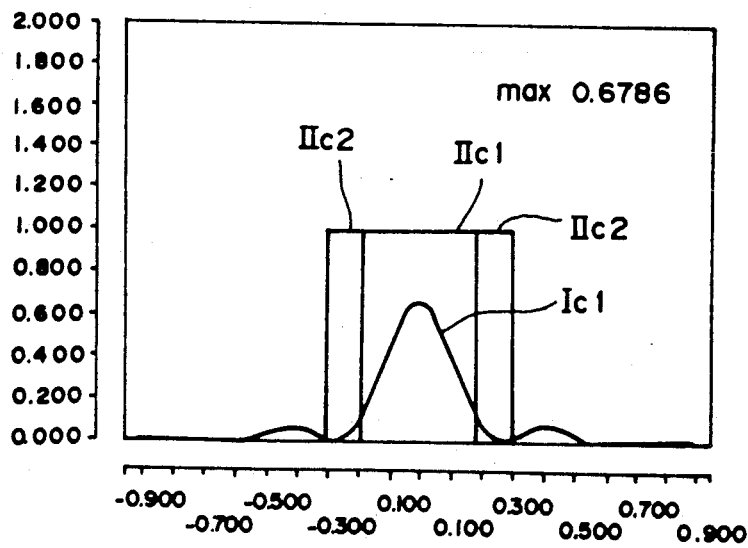
Figure 7A:
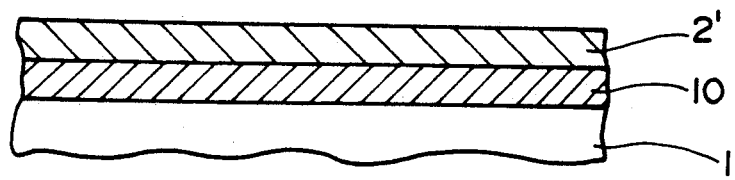
FIG. 7 (a) through (f) illustrate sequential steps in manufacture of Embodiment-1 with sectional views of a phase shifting mask during such steps.
Figure 7B:
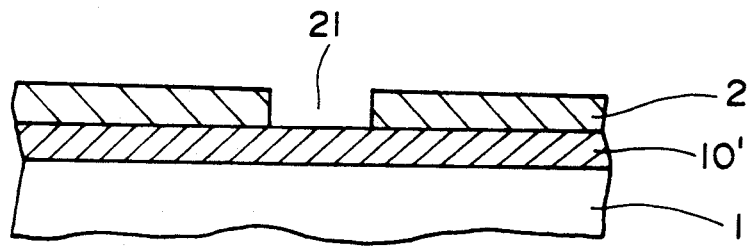
Figure 7C:
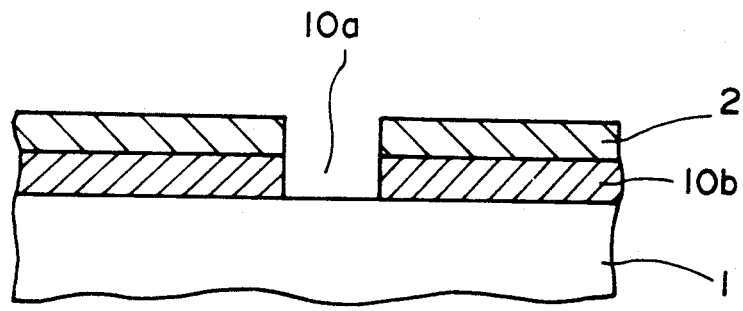
Figure 7D:
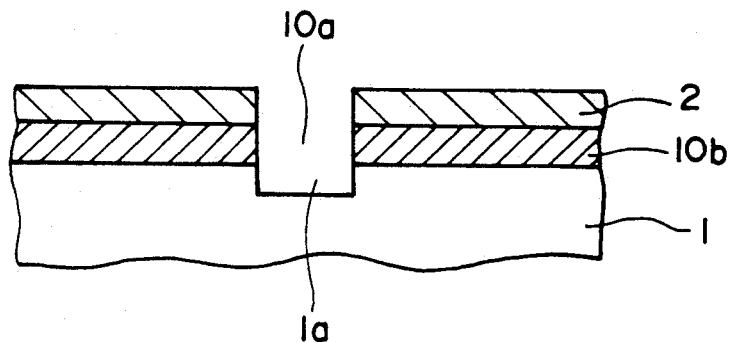
Figure 7E:
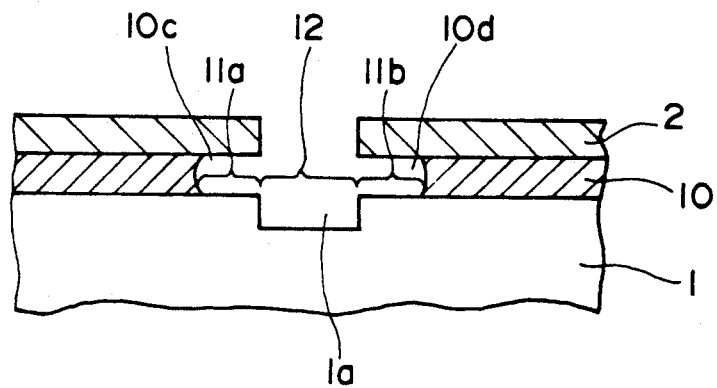
Figure 7F:
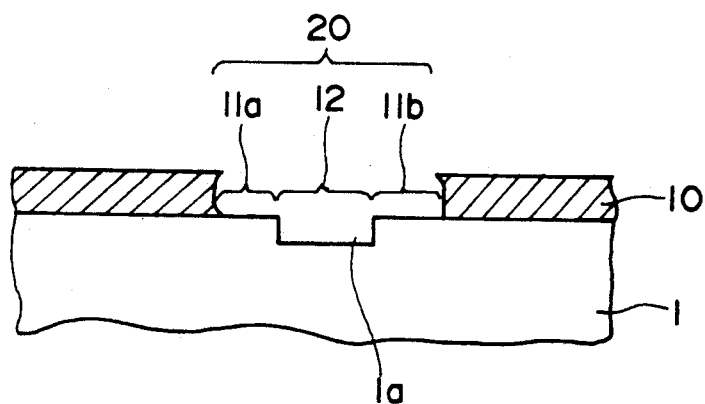
Figure 8A:
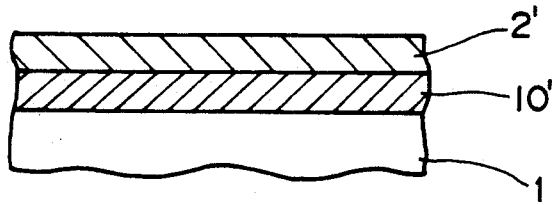
FIG. 8 (a) through (f) similarly illustrate sequential steps for Embodiment-2.
Figure 8B:
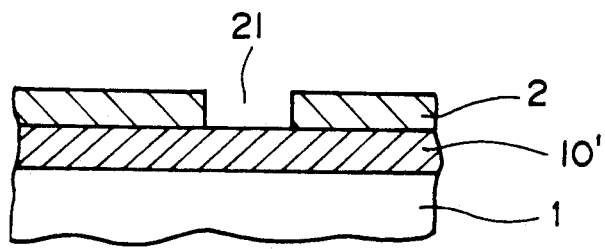
Figure 8C:
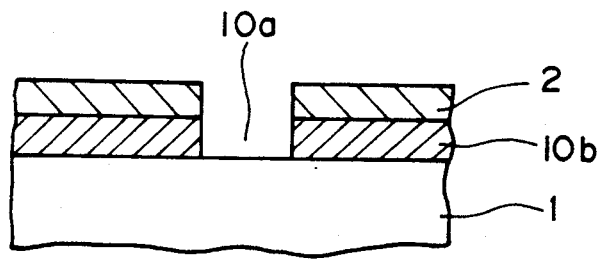
Figure 8D:
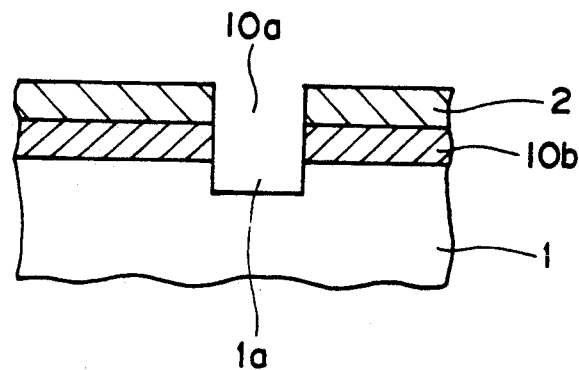
Figure 8E:
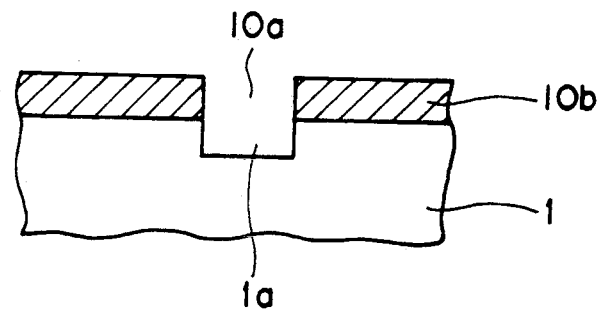
Figure 8F:
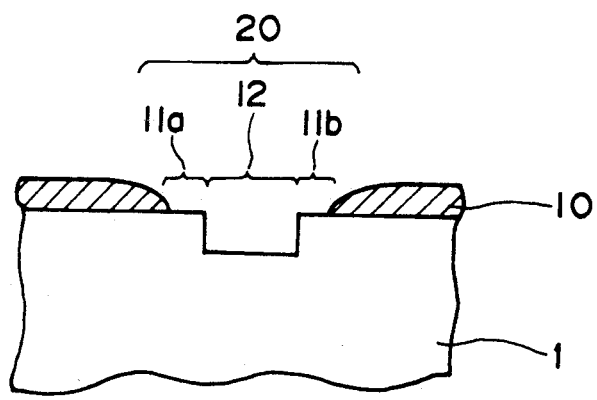

The plan-view construction of the phase shifting mask may be shaped into a contact hole pattern of FIG. 4 (b) or a line (space) pattern of FIG. 4 (a).

According to the method described above, a desired structure can be achieved with merely a single plotting step (FIG. 7 (b)) which requires the highest precision and the longest time.

Embodiment-2

In this embodiment, a light shielding layer 10' is formed of chromium or the like on a substrate 1 (of quartz, silicon dioxide or the like) having a light transmitting property, as illustrated in FIG. 8 (a). The thickness of the light shielding layer 10' is selectively determined to be greater than the thickness of a light shielding region 10 which is to be finally obtained. And a resist 2' is formed thereon by coating or the like to produce a structure of FIG. 8 (a).

Subsequently a plotting step is executed, and then the resist 2 is exposed and developed to form a resist opening 21, thereby producing a resist pattern 2 illustrated in FIG. 8 (b).

Thereafter the light shielding layer 10' is anisotropically etched while being masked with the resist pattern 2, whereby an opening 10a is formed in the light shielding layer to obtain a structure of FIG. 8 (c). Since the opening 10a corresponds to the phase shifting segment 12 (see FIG. 8 (f)) in a desired final structure, both the opening 10a and the resist opening 21 are formed to have proper dimensions conforming therewith.

Subsequently the substrate 1 is anisotropically etched while being masked with the resist pattern 2, thereby obtaining a structure of FIG. 8 (d) with a substrate recess 1a. Since this recess 1a serves as the phase shifting segment 12, the depth d thereof in this embodiment is so selected as to be equal to that of the substrate recess 1a in Embodiment-1 for maximizing the phase shifting effect.

Then the resist pattern 2 is removed to attain a state illustrated in FIG. 8 (e).

Next, isotropic etching is executed to remove the light shielding layer in the periphery of the recess 1a, thereby producing a structure of FIG. 8 (f). The isotropic etching may be carried out by any proper means capable of isotropically etching the light shielding material, and a wet etching means may be employed as well. As the portions to be removed by such isotropic etching serve as light transmitting segments 11a, 11b, the required amount of etching is determined in conformity therewith.

Due to the above structure, there is obtained, merely by a single plotting step, the phase shifting mask structure of FIG. 8 (f) which comprises a transparent region 20 with respect to the exposure light and a light shielding region 10 to shield such exposure light, wherein the transparent region 20 has light transmitting segments 11a, 11b to directly transmit the exposure light therethrough, and the phase shifting segment 12 to transmit the exposure light therethrough with a phase difference from the light passed through the light transmitting segments.

Embodiment-3

Figure 9A:
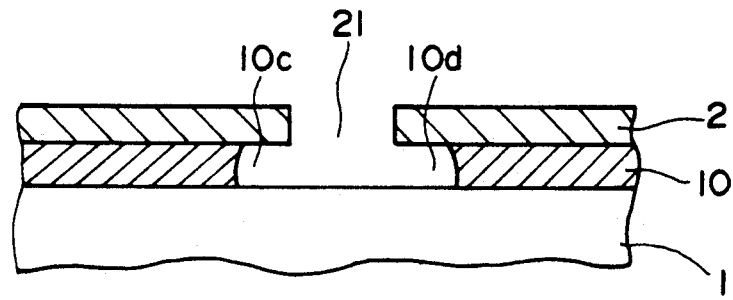
FIG. 9 (a) through (c) similarly illustrate sequential steps for Embodiment-3.
Figure 9B:
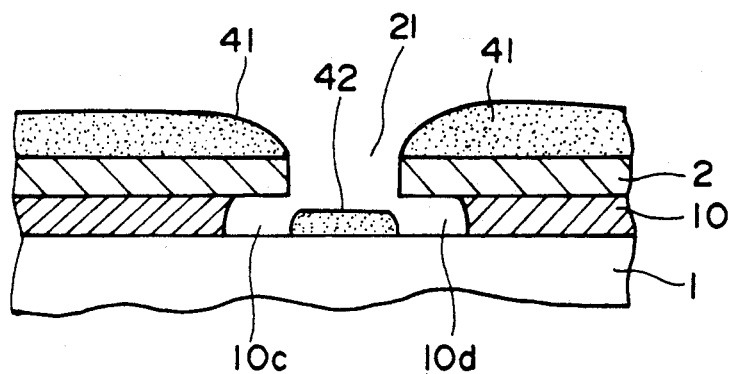
Figure 9C:
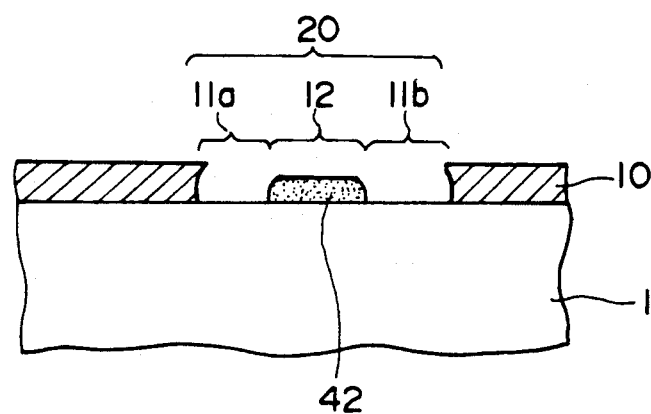
Figure 10A:
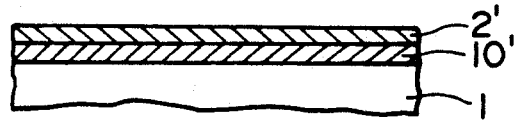
FIG. 10 (a) through (f) illustrate sequential steps in manufacturing the phase shifting mask of Embodiment-4 of the present invention.
Figure 10B:
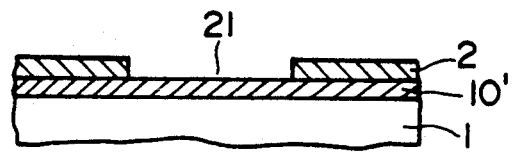
Figure 10C:
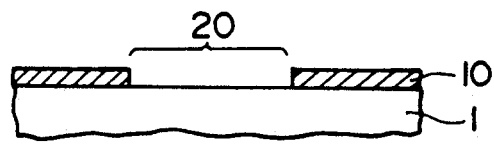
Figure 10D:
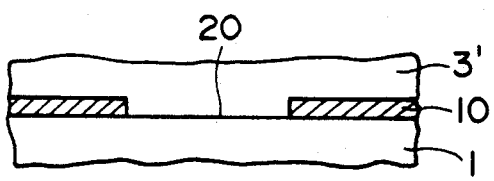
Figure 10E:
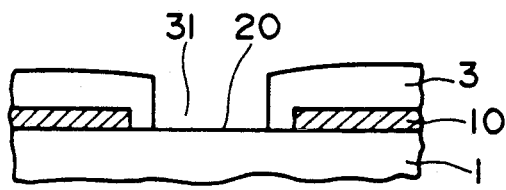
Figure 10F:
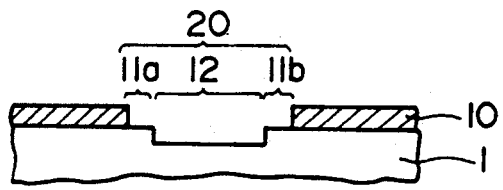

In comparison with Embodiment-1 and Embodiment-2 where segments for causing a phase difference between light rays transmitted therethrough are formed by partially changing the thickness of the substrate 1, this embodiment is so contrived as to form a projection 42 on the substrate 1 out of a suitable material having a phase shifting effect, wherein such projection is used as the phase shifting region 12 (see FIG. 9 (c)).

In the manufacture of this embodiment, the same steps as those for Embodiment-1 are executed in an early stage. More specifically, the steps of FIG. 7 (a) through (c) are common to Embodiment-1 until forming the structure of FIG. 7 (c). Therefore a detailed description regarding such steps is omitted here, and the illustrations of FIG. 7 (a) through (c) are directly applied.

Thereafter in the state of FIG. 7 (c), first the light shielding pattern 10b is side-etched to obtain a structure of FIG. 9 (a) with portions 10c, 10d where the light shielding layer has been removed. Namely, in contrast with Embodiment-1 where the substrate 1 is etched, such etching is not executed in this embodiment and the side etching is started immediately.

Then a suitable material having a phase shifting effect such as silicon dioxide is evaporated by means of CVD (chemical vapor deposition) or the like, thereby forming a projection 42 of a phase shifting material of a size corresponding to a resist opening 21 in a resist pattern 2, as illustrated in FIG. 9 (b). And simultaneously therewith, a film of a phase shifting material is formed on the resist pattern 2 as well.

With subsequent removal of the resist pattern 2, the film 41 is also removed to consequently obtain a phase shifting mask structure of FIG. 9 (c) which comprises a light shielding region 10 and a transparent region 20 having a phase shifting segment 12 composed of the phase shifting projection 42 and the light transmitting segments 11a, 11b formed by the side etching.

In this embodiment also, merely a single plotting step is sufficient as in Embodiment-1.

Now a description will be given with regard to another method of producing a phase shifting mask structure similar to the above, although the following examples are disadvantageous as compared with Embodiments 1 through 3 in the point that the plotting step needs to be executed twice.

Embodiment-4

First, as illustrated in FIG. 10 (a), a light shielding film 10' is formed on a transparent substrate of quartz or the like by evaporation of a light shielding material such as chromium, and a resist film 2' is formed thereon. Subsequently an opening 21 of a size corresponding to a desired transparent region 20 (see infra FIG. 10 (c)) is formed by ordinary photolithography to obtain a resist pattern 2 (FIG. 10 (b)).

The light shielding film 10' is partially removed by etching or the like while being masked with the resist pattern 2, and then the remaining resist pattern is removed to produce a structure of FIG. 10 (c) which includes a light shielding region 10 and a transparent region 20.

Thereafter a resist 3' is formed on the entire surface as illustrated in FIG. 10 (d).

In a next step, an opening 31 of a size corresponding to a light transmitting segment 12 is formed in the resist 3' to obtain a resist pattern 3 as illustrated in FIG. 10 (e).

Figure 11A:
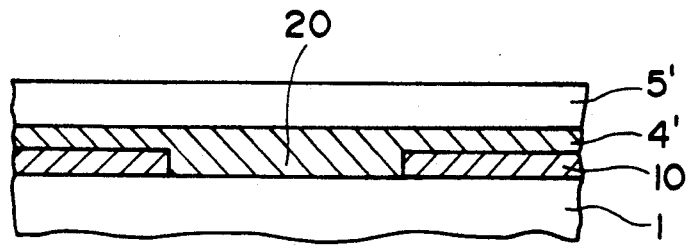
FIG. 11 (a) through (c) illustrate the steps in manufacturing the phase shifting mask of Embodiment-5 (in which the steps of FIG. 10 (a) through (c) are common to Embodiment-4)
Figure 11B:
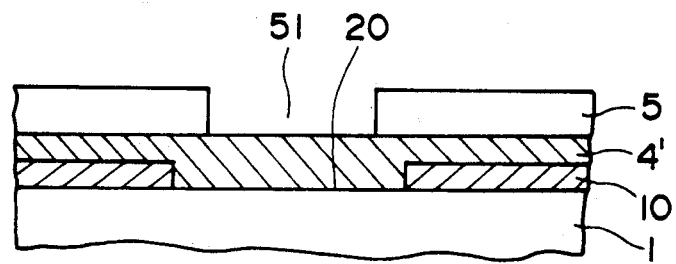
Figure 11C:
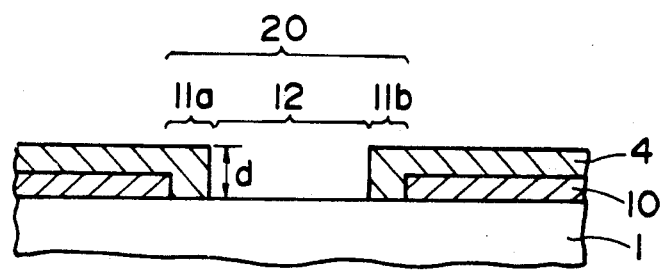

The substrate 1 is partially etched while being masked with such resist pattern 3 so that, as illustrated in FIG. 11 (f), the central portion of the transparent region 20 becomes smaller in thickness. This central portion serves as a light transmitting segment 12, and both of its sides serve as phase shifting segments 11a, 11b.

Thus, in this embodiment, the phases of transmitted light rays are rendered mutually different by partially changing the thickness of the substrate 1, thereby forming the light transmitting segment 12 and the phase shifting segments 11a, 11b.

Embodiment-5

In this embodiment, the steps until forming a light shielding region 10 and a transparent region 20 in FIG. 10 (c) are the same as those in manufacturing Embodiment-4 of FIG. 10.

Thereafter, as illustrated in FIG. 11 (a), a layer 4' having a phase shifting effect is formed, and a resist film 5' is formed thereon. Then an opening 51 corresponding to a light transmitting region 12 (FIG. 11 (c)) is formed in the resist film 5' by photolithography to produce a resist pattern 5 (FIG. 11 (b)). The material 4' having a phase shifting effect is patterned by etching or the like while being masked with such resist pattern 5. Subsequently the resist pattern 5 is removed to obtain the structure of FIG. 11 (c). In this structure, a projection 4 of the phase shifting material is formed in a thickness d on both sides of the transparent region 20 to serve as a phase shifting mask. The portions where such projection 4 is existent on the transparent region 20 are used as phase shifting segments 11a, 11b, while any other portion of the transparent region 20 is used as a light transmitting segment 12.

The thickness d of the projection 4 is so selected as to be optimal for attaining a desired phase shift. For example, the thickness d determined according to the aforementioned equation is selected to cause a phase shift of 180°.

In this embodiment, the phase shifting segments 11a, 11b are composed of a phase shifting film as described above. And the material suited for such a film may be, in addition to silicon dioxide, an organic material such as polyimide resin or a resist material, or an inorganic material such as silicon nitride. It is also possible to use any material that can be processed to finally become silicon dioxide by baking, such as SOG.

Embodiment-6

In this embodiment, the steps from FIG. 10 (a) to FIG. 10 (e) are the same as those in the manufacture of Embodiment-4, whereby the structure of FIG. 10 (e) is obtained with a resist pattern 3 formed on a light shielding region 10.

Figure 12A:
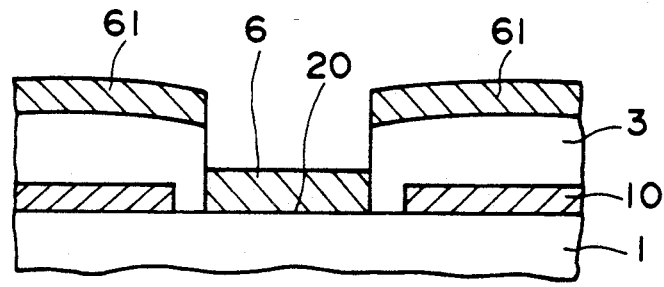
FIG. 12 (a) and (b) illustrate the steps in manufacturing the phase shifting mask of Embodiment-6 (in which the steps of FIG. 10 (a) through (e) are common to Embodiment-4).
Figure 12B:
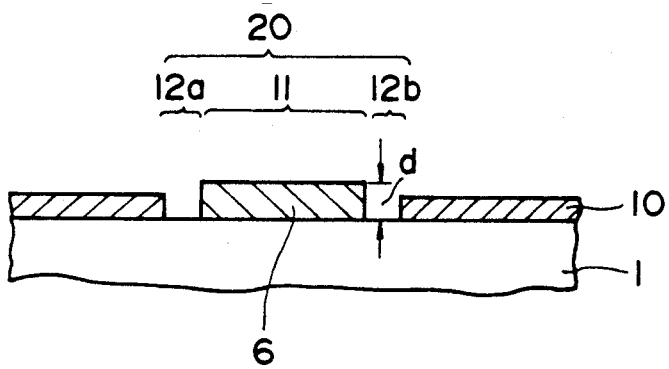

Subsequently a material having a phase shifting effect is deposited as illustrated in FIG. 12 (a), whereby a projection 6 of the phase shifting material is formed in the portion of the transparent region 20 of the substrate 1 not covered with the resist pattern 3. And simultaneously a film 61 of the phase shifting material is formed on the resist pattern 3 as well.

Then the resist pattern 3 is removed. Thus, as illustrated in FIG. 12 (b), a phase shifting segment 11 composed of the projection 6 is formed at the center of the transparent region 20, and light transmitting segments 12a, 12b are formed on both sides of the segment 11. In this stage, the film 61 of the phase shifting material deposited on the resist pattern 3 in the step of FIG. 12 (a) has already been removed together with the resist pattern 3.

In comparison with Embodiment-5 where the light transmitting segment 12 is formed at the center of the transparent region 20, Embodiment-6 is a reverse example where the phase shifting segment 11 is formed at the center of the transparent region 20, and both of its sides are used as light transmitting segments 12a, 12b.

The thickness d and the material of the projection 6 to be used as a phase shifting segment are the same as those in Embodiment-5.

Although various minor changes and modifications might be proposed by those skilled in the art, it will be understood that we wish to include within the claims of the patent warranted hereon all such changes and modifications as reasonably come within our contribution to the art.

What is claimed is:

1. A method for manufacture of a phase shifting mask, comprising the steps of:
   forming a light shielding layer on a substrate;
   forming a photoresist on said light shielding layer;
   patterning said photoresist to form a resist pattern;

forming an opening in said light shielding layer by the use of said resist pattern as a mask, thereby forming a light shielding pattern;

etching said substrate anisotropically to form a phase shifting segment;

side etching said light shielding pattern to form a light shielding region; and removing said resist pattern.

2. A method for manufacture of a phase shifting mask, comprising the steps of:

forming a light shielding layer on a substrate;

forming a photoresist on said light shielding layer;

patterning said photoresist to form a resist pattern;

forming an opening in said light shielding layer by the use of said resist pattern as a mask, thereby forming a light shielding pattern;

etching said substrate anisotropically to form a phase shifting segment;

removing said resist pattern; and etching said light shielding pattern isotropically to form a light shielding region.

3. A method for manufacture of a phase shifting mask, comprising the steps of:

forming a light shielding layer on a substrate;

forming a photoresist on said light shielding layer;

patterning said photoresist to form a resist pattern;

forming an opening in said light shielding layer by the use of said resist pattern as a mask, thereby forming a light shielding pattern;

side etching said light shielding pattern to form a light shielding region;

depositing a phase shifting material in said opening by the use of said resist pattern as a mask; and removing said resist pattern together with the phase shifting material thereon to form a phase shifting segment in said opening.

* * * * *